(12) United States Patent
Toda et al.

(10) Patent No.: US 6,330,650 B1
(45) Date of Patent: Dec. 11, 2001

(54) DATA RECEIVER THAT PERFORMS SYNCHRONOUS DATA TRANSFER WITH REFERENCE TO MEMORY MODULE

(75) Inventors: Haruki Toda, Yokohama; Hitoshi Kuyama, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/064,554

(22) Filed: Apr. 23, 1998

(30) Foreign Application Priority Data

Apr. 25, 1997 (JP) .................................................. 9-109126

(51) Int. Cl.[7] .............................. G06F 13/00; G06F 1/06; G11C 7/22
(52) U.S. Cl. ................................ 711/167; 711/5; 710/61; 710/35; 713/400; 713/501; 365/233
(58) Field of Search ............................... 711/5, 154, 167; 710/129, 130, 61, 35; 713/400, 500, 501; 365/233

(56) References Cited

U.S. PATENT DOCUMENTS 5,758,188 * 5/1998 Appelbaum et al. ................... 710/35
5,933,623 * 8/1999 Umemura et al. .................... 713/400

\* cited by examiner

Primary Examiner—Glenn Gossage
(74) Attorney, Agent, or Firm—Banner & Witcoff, Ltd.

(57) ABSTRACT

A data receiver is incorporated in a controller which receives data from memory modules. The data transfer is provided with an S receiver and a D receiver. The S receiver is driven on the basis of first multiphase clocks and receives strobe signals. The D receiver is driven on the basis of outputs from the S receiver, which receives states of the strobe signals at the respective times, and the second multiphase clocks which lag the first multiphase clocks by a predetermined length of time. The D receiver receives data and transfers the same. The S receiver is controlled for burst data transfer such that the S receiver is set in an active state immediately before a strobe signal corresponding to a start item of burst data rises, and is set in an inactive state after a last item of the burst data is received. A multiphase clock generator is provided. The multiphase clock generator generates the first and second multiphase clocks which have predetermined phase differences and are equal in period.

28 Claims, 11 Drawing Sheets

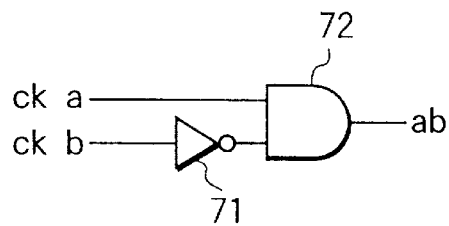
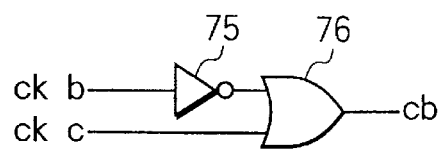
FIG. 9A
FIG. 9C
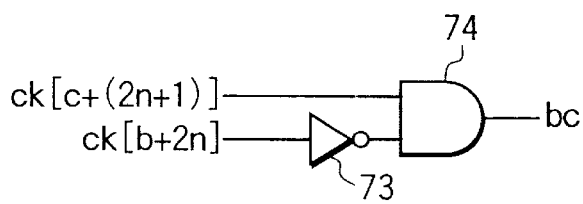
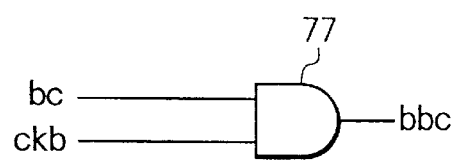
FIG. 9B
FIG. 9D
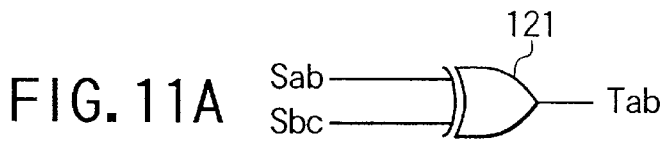
FIG. 11A
FIG. 11B
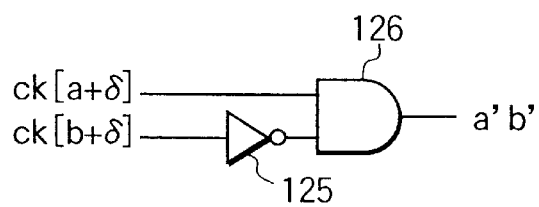
FIG. 12A
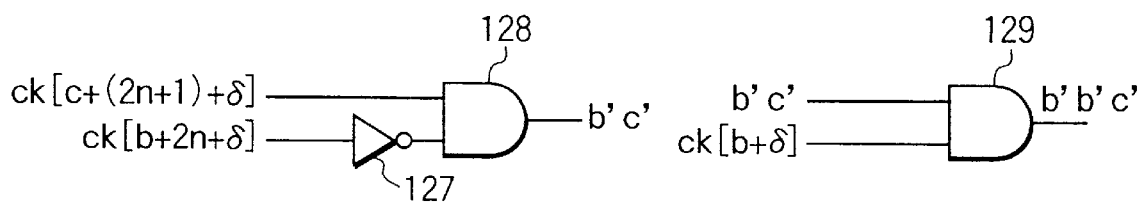
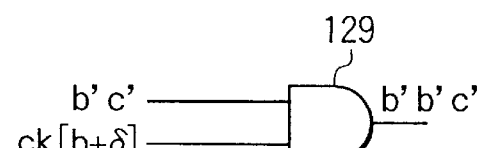
FIG. 12B
FIG. 12C

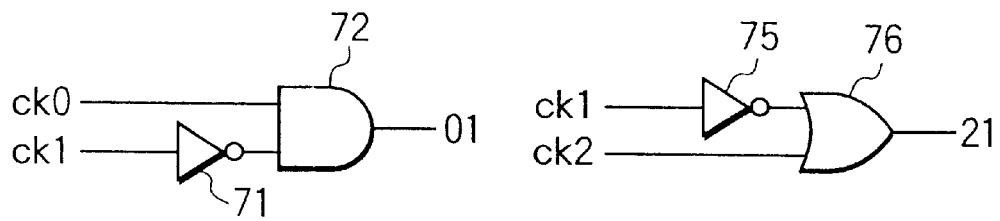
FIG. 18A
FIG. 18C
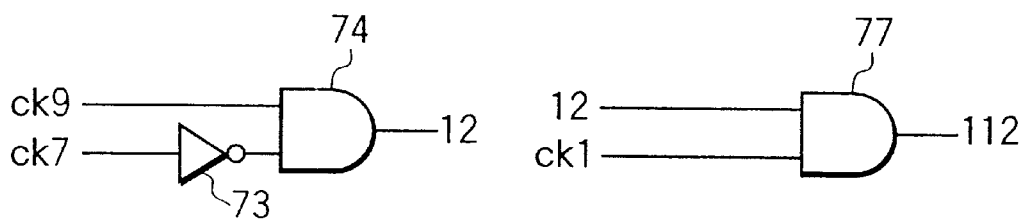
FIG. 18B
FIG. 18D
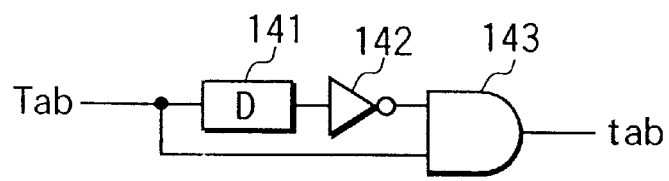
FIG. 19A
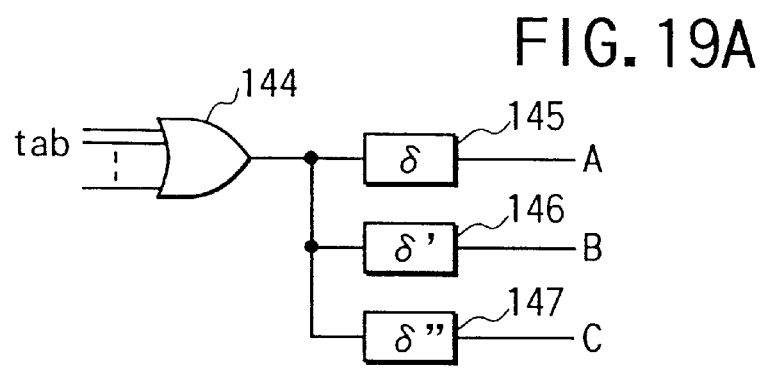
FIG. 19B

DATA RECEIVER THAT PERFORMS SYNCHRONOUS DATA TRANSFER WITH REFERENCE TO MEMORY MODULE

BACKGROUND OF THE INVENTION

The present invention relates to a controller provided on a circuit board along with memory modules so as to control the memory modules, each memory module comprising a source synchronous DRAM which, like a synchronous DRAM, outputs a strobe signal in synchronism with read data and transfers the read data. More particularly, the present invention relates to a data receiver incorporated in the controller and capable of performing high-speed, reliable synchronous data transfer with reference to the memory module.

In general, a semiconductor memory is used as a DIMM (Dual Inline Memory Module) when it is incorporated in a personal computer, etc. Eight or sixteen memory chips are provided on the board of the DIMM, and data or signals are input or output by way of connector pins printed on both sides of the board. A memory board employed in a personal computer or the like has four sockets and a controller, and four DIMMs can be provided on the memory board.

FIG. 1 is a conceptual illustration of a memory board on which a controller 151 and four DIMMs (DIMM1 to DIMM4) are provided. In order to control the memory chips of the DIMMs in synchronism with one another, four clocks CLK are sent from the controller 151 to the four DIMMs in parallel. From the DIMMs, 64-bit parallel data are simultaneously transferred by way of a common data bus.

What becomes a problem with this type of memory board is the timing at which the controller fetches data supplied from each DIMM. Since the distance between the controller and one DIMM differs from that between the controller and another DIMM, the flight time (the time needed for a signal to propagate from one point to another, one point corresponds to the controller, and the second point corresponds to a DIMM) of clock signals and data inevitably differs, depending upon the DIMMs. In other words, the data fetch timing has to be controlled by detecting which DIMM is accessed by the controller.

In order to solve the problems described above, 4-bit strobe signals QS are output in parallel from the DIMMs and supplied to the controller. In the example shown in FIG. 1, the transfer lines through which data DQ and strobe signals QS are sent are under the same load condition, and a 1-bit strobe signal QS is used for each 16-bit data DQ. The controller monitors the strobe signals QS so as to fetch data in synchronism with the receipt of the strobe signals QS.

FIG. 2 shows how clock signal CLK, data, and strobe signal QS are related to one another when the data transfer is executed according to a so-called DDR (Double Date Rate) system, i.e., a system in which 2-bit data are output in response to the rise of clock signal CLK. In FIG. 2, the data transfer from DIMM1 and DIMM4 is also shown, so as to indicate how the signal transmission times are different for the DIMMs. Although DIMM1 and DIMM2 do not simultaneously output data in practice, they are depicted as doing so, so as to indicate the time relationships between them.

When a clock CLK is supplied from the controller to each DIMM, the time needed for the clock CLK to reach DIMM4 is longer than the times needed for the same clock CLK to reach the other DIMMs. Although the memories of the DIMMs output data in synchronism with the clock CLK, the output timings are naturally different. In addition, since the data output from the DIMMs require different lengths of time to reach the controller, the difference between the timings at which the controller receives data inevitably increases. This being so, the controller cannot receive data in synchronism with the clocks CLK; it fetches data, with the strobe signal QS used as a trigger signal. The data window based on which data is fetched in synchronism with the strobe signal QS is restricted due to a so-called skew, i.e., the difference between the timings of data and strobe signals. In FIG. 2, the time indicated by the oblique lines corresponds to the data window. In order to reliably fetch data within a very restricted time range even in a case where the data is supplied to the controller in an asynchronous manner, the data receiver incorporated in the controller to receive data DQ has to be specially designed.

BRIEF SUMMARY OF THE INVENTION

The present invention has been conceived in consideration of the above problems, and an object of the invention is to provide a data receiver and a memory system that enable accurate control of the data fetch timing even if data are transferred from the memory module to the controller without reference to the system clocks due to irregular flight times.

A data receiver according to the present invention comprises a first receiver and a second receiver. The first receiver receives a plurality of strobe signals, which are supplied thereto along with data, in synchronism with a plurality of first clocks, and generates actuation signals to be supplied to the second receiver. The second receiver receives data, which are supplied thereto along with the plurality of strobe signals, in synchronism with a plurality of second clocks, which have predetermined phase differences with respect to the respective first clocks. Based on this control, the data can be fetched in a reliable manner even if the data and strobe signals are supplied to the data receiver at timings that are made irregular due to various factors.

The present invention provides a data receiver adapted for use in a system wherein data transfer is performed based on data and strobe signals which are supplied to the system simultaneously with the data. The data receiver is made up of: a plurality of first receivers, driven at predetermined time intervals, for receiving the strobe signals; and at least one second receiver, driven based on outputs from the first receivers, for receiving and transferring the data.

The present invention also provides a data receiver adapted for use in a system wherein data transfer is performed based on data and strobe signals which are supplied to the system simultaneously with the data and represent time positions of the data. The data receiver is made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which receives an actuating signal and transfer states of the received data; and a circuit which generates the actuating signal to be supplied to the second receiver, on the basis of an output from the first receiver.

The present invention further provides a data receiver adapted for use in a system wherein data transfer is performed based on data and strobe signals which are supplied to the system simultaneously with the data and represent time positions of the data. The data receiver is made up of:

a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of the units, receives data in response to the multiphase clocks, and transfers the received data; a circuit which generates the unit actuating signals to be supplied to the second receiver on the basis of an output from the first receiver.

The present invention further provides a data receiver adapted for use in a system wherein data transfer is performed based on data and strobe signals which are supplied to the system simultaneously with the data and represent time positions of the data. The data receiver is made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of these units, receives data in response to the multiphase clocks, and transfers the received data; and a circuit which generates the unit actuating signals to be supplied to the second receiver on the basis of an output from the first receiver, the multiphase clocks to which the units of the first receiver are responsive and the multiphase clocks to which the units of the second receiver are responsive being different from each other and having a predetermined phase relationship.

The present invention further provides a data receiver adapted for use in a system wherein data transfer is performed based on data and strobe signals which are supplied to the system simultaneously with the data and represent time positions of the data. The data receiver is made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of the units, receives data in response to the multiphase clocks, and transfers the received data; and a circuit which generates the unit actuating signals to be supplied to the second receiver on the basis of an output from the first receiver, the multiphase clocks to which the units of the first receiver are responsive and the multiphase clocks to which the units of the second receiver are responsive being different from each other and having a predetermined phase relationship, and the second receiver receiving data in succession at least twice on the basis of a group of two or more multiphase clocks having two or more phase relationships.

The present invention further provides a memory system comprising: a plurality of memory modules which output data and strobe signals indicating time positions of the data; and a controller including a data receiver which receives the data and the strobe signals from the memory modules, the data receiver being made up of: a plurality of first receivers, driven at predetermined time intervals, for receiving the strobe signals; and at least one second receiver, driven based on outputs from the first receivers, for receiving data and transferring the data.

The present invention further provides a memory system comprising: a plurality of memory modules which output data and strobe signals indicating time positions of the data; and a controller including a data receiver which receives the data and the strobe signals from the memory modules, the data receiver being made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintains states of the received strobe signals for a predetermined length of time, and then outputs the states of the strobe signals; a second receiver which responds to an actuating signal and transfers a state of received data; and a circuit which generates the actuating signal to be supplied to the second receiver on the basis of an output from the first receiver.

The present invention further provides a memory system comprising: a plurality of memory modules which output data and strobe signals indicating time positions of the data; and a controller including a data receiver which receives the data and the strobe signals from the memory modules, the data receiver being made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of these units, receives data in response to the multiphase clocks, and transfers the received data; and a circuit which generates the unit actuating signals to be supplied to the second receiver on the basis of an output from the first receiver.

The present invention further provides a memory system comprising: a plurality of memory modules which output data and strobe signals indicating time positions of the data; and a controller including a data receiver which receives the data and the strobe signals from the memory modules, the data receiver being made up of: a multiphase clock generator for generating a plurality of clocks which have predetermined phase differences and are the same in period; a first receiver which includes units corresponding in number to the multiphase clocks generated by the multiphase clock generator, to units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of these units, receives data in response to the multiphase clocks, and transfers the received data; and a circuit which generates the unit actuating signals to be supplied to the second receiver on the basis of an output from the first receiver, the multiphase clocks to which the units of the first receiver are responsive and the multiphase clocks to which the units of the second receiver are responsive being different from each other and having a predetermined phase relationship.

The present invention further provides a memory system comprising: a plurality of memory modules which output data and strobe signals indicating time positions of the data; and a controller including a data receiver which receives the data and the strobe signals from the memory modules, the data receiver being made up of: a multiphase clock generator for generating a plurality of clocks which have predetermined phase differences and are the same in period; a first receiver which includes units corresponding in number to the multiphase clocks generated by the multiphase clock generator, the units receive the strobe signals in response to the multiphase clocks, maintain states of the received strobe signals for a predetermined length of time, and then output the states of the strobe signals; a second receiver which includes units corresponding in number to the multiphase clocks generated by the multiphase clock generator, responds to unit actuating signals at respective ones of these units, receives data in response to the multiphase clocks, and transfers the received data; and a circuit which generates the unit actuating signals to be supplied to the second receiver on the basis of an output from the first receiver, the multiphase clocks to which the units of the first receiver are responsive and the multiphase clocks to which the units of the second receiver are responsive being different from each other and having a predetermined phase relationship, and the second receiver receiving data in succession at least twice on the basis of a group of two or more multiphase clocks having two or more phase relationships.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A through 9D are circuit diagrams each showing a specific circuit configuration of a control signal generating circuit, which is employed in the S receiver depicted in FIG. 8 to generate control signals.

FIGS. 11A and 11B are circuit diagrams showing specific examples of a control signal generating circuit which generates a control signal for controlling the D receiver depicted in FIG. 10.

FIGS. 12A through 12C are circuit diagrams showing specific examples of a control signal generating circuit which is different from that shown in FIGS. 11A–11B and which generates a control signal for controlling the D receiver depicted in FIG. 10.

FIGS. 18A through 18D are circuit diagrams, each showing a specific configuration of a control signal generating circuit which generates the control signals to be used in the given circuit unit A, the given circuit unit A being one of a plurality of circuit units A included in the S receiver depicted in FIG. 16.

FIGS. 19A and 19B are circuit diagrams, each showing a circuit configuration of a control signal generating circuit provided for the D receiver of the data receiver according to the second embodiment of the present invention.

DETAILED DESCRIPTION OF THE INVENTION

Embodiments of the present invention will now be described with reference to the accompanying drawings.

Figure 1:
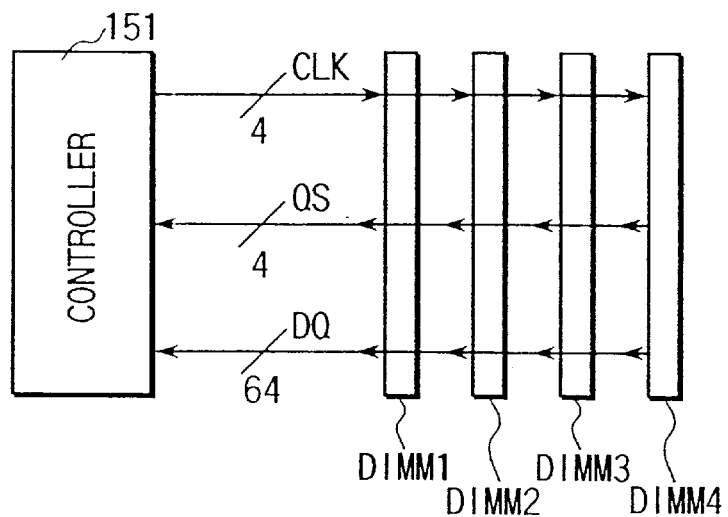
FIG. 1 is a conceptual illustration of a conventional memory board on which a controller and four DIMMs are provided.
Figure 2:
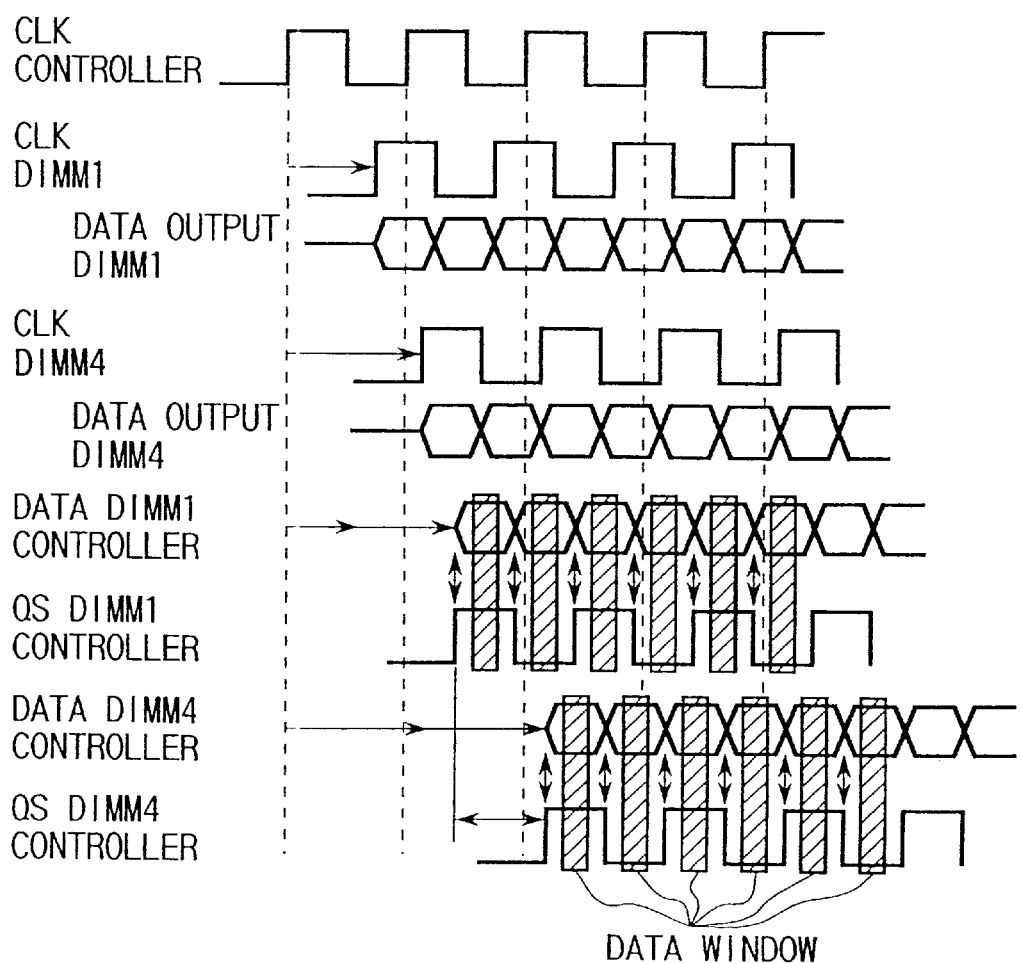
FIG. 2 is a timing chart showing how a clock signal, data, and a strobe signal QS are related to one another when data transfer is executed on the memory board depicted in FIG. 1.
Figure 3:
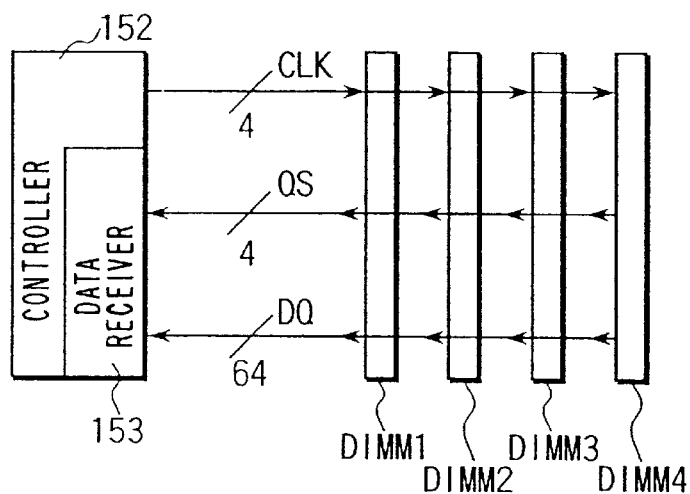
FIG. 3 is a conceptual illustration showing a memory system according to one embodiment of the present invention.

FIG. 3 is a conceptual illustration of a memory board according to the first embodiment of the present invention. In this embodiment, a controller 152 and four DIMMs (DIMM1–DIMM4) are mounted on a memory board, as in the conventional art. Four clocks CLK, which are the same in frequency, are supplied from the controller 152 to the four DIMMs in parallel, so as to control the memory chips of the DIMMs in synchronism with each other. From the DIMMs, 64-bit parallel data DQ are supplied to the controller 152 by way of the same data bus. Along with the data, 4-bit strobe signals QS are output from the DIMMs and supplied to the controller 152. The data DQ and the strobe signals QS transferred from the DIMM are received by a data receiver 153 incorporated in the controller 152.

Figure 4:
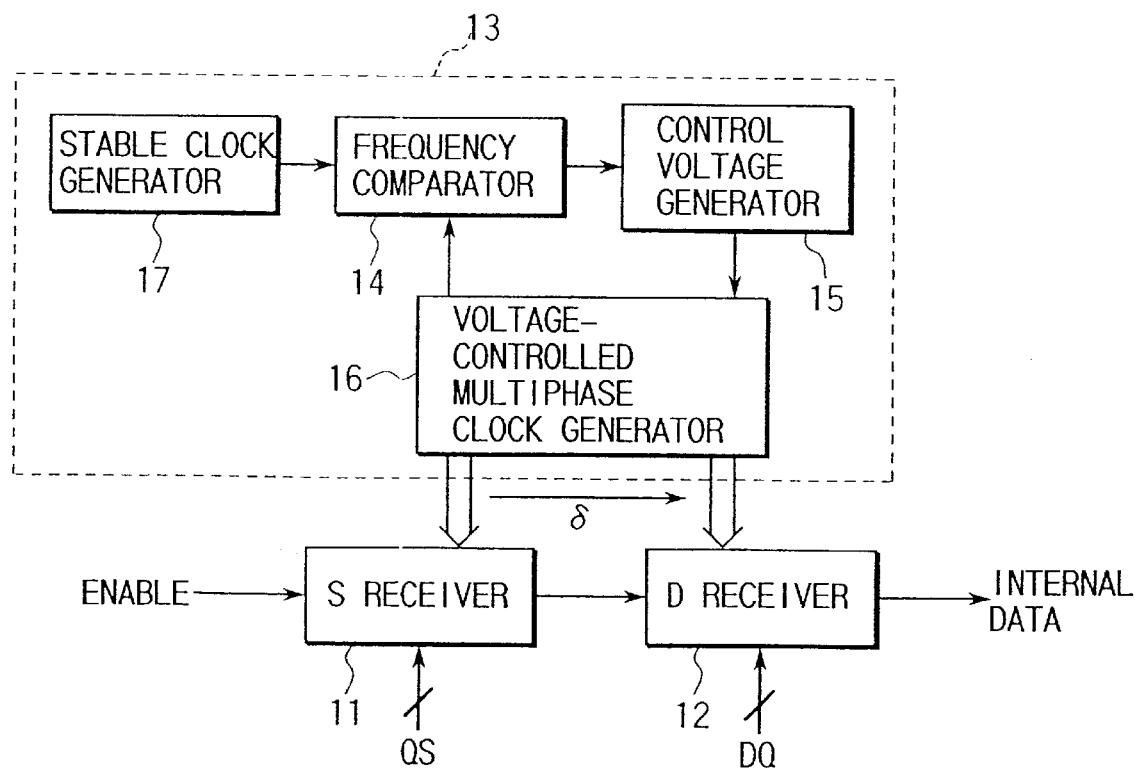
FIG. 4 is a block circuit diagram showing a data receiver incorporated in the controller of the memory system shown in FIG. 3.

FIG. 4 is a block circuit diagram showing the internal configuration of the data receiver 153. This data receiver includes an S receiver 11 for fetching the strobe signal QS and a D receiver 12 for fetching the data DQ. The driving of these receivers is controlled by multiphase clocks. The clocks used for controlling the D receiver 12 lag the clocks used for controlling the S receiver 11 by a phase difference of δ.

The S receiver 11 is allowed to receive data when it is supplied with an ENABLE signal, while the D receiver 12 is allowed to receive data when it is supplied with a signal from the S receiver (the signal from the S receiver is used as an ENABLE signal). The data received at the D receiver 12 is supplied to an internal circuit of the controller 152.

The multiphase clocks are generated by a stable multiphase clock generator 13. It is required that the multiphase clocks used for controlling the S receiver 11 and D receiver 12 be stable clocks. To satisfy this requirement, the multiphase clocks are generated by the stable multiphase clock generator 13. In this stable multiphase clock generator 13, a frequency comparator 14 compares the frequencies of generated clocks with one another. If the generated clocks differ in phase, a control voltage generator 15 generates a voltage corresponding to the phase difference. Based on this voltage, a voltage-controlled multiphase clock generator 16 is controlled, thus maintaining a stable frequency. The clocks subjected to the comparison by the frequency comparator 14 are generated by a stable clock generator 17, and the clocks generated thereby are stabilized in frequency by quartz oscillation, for example.

A specific example of each of the circuits of the data receiver shown in FIG. 4 will be described.

Figure 5A:
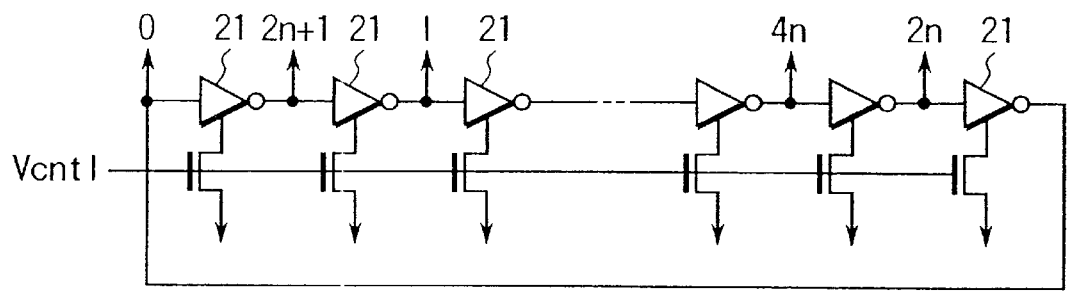
FIG. 5A is a circuit diagram showing a detailed configuration of a voltage-controlled multiphase clock generator that is incorporated in the data receiver depicted in FIG. 4.
Figure 5B:
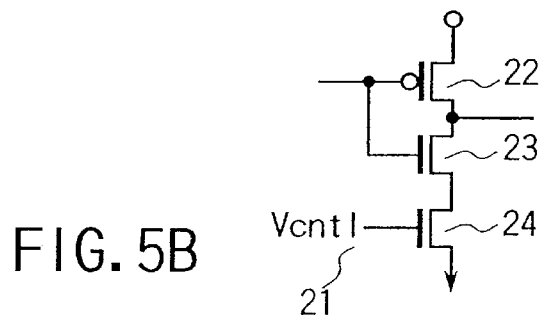
FIG. 5B is a specific circuit diagram showing part of the circuit depicted in FIG. 4.

FIGS. 5A and 5B show a specific circuit configuration of the voltage-controlled multiphase clock generator 16 described above. As shown in FIG. 5A, the voltage-controlled multiphase clock generator 16 is a (4n+1)-stage ring oscillator made up of (4n+1) signal inverters 21. As shown in FIG. 5B, each signal inverter 21 comprises a P-channel metal oxide semiconductor (MOS) transistor 22, an N-channel MOS transistor 23, and an N-channel MOS transistor 24. The gates of MOS transistors 22 and 23 are connected together, and the drains of them are also connected together. The point of connection between the gates serves as an input node, and the point of connection between the drains serves as an output node. The N-channel MOS transistor 24 is connected between the source of the N-channel MOS transistor 23 and a ground voltage node. The gate of that N-channel MOS transistor 24 is applied with control voltage Vcntl generated by the control voltage generator 15 depicted in FIG. 4.

This type of ring oscillator starts oscillating and generates clocks when a power supply voltage is applied thereto. The oscillation period is controlled based on control voltage Vcntl. The oscillation clocks at the nodes are numbered as 0, 2n+1, 1, ..., 4n, 2n, respectively, as indicated in FIG. 5A.

The duty of these clocks is 50%, and the clocks constitute multiphase clocks that rise in the order of their numbers. The multiphase clocks are used for the control of the receivers.

Figure 6:
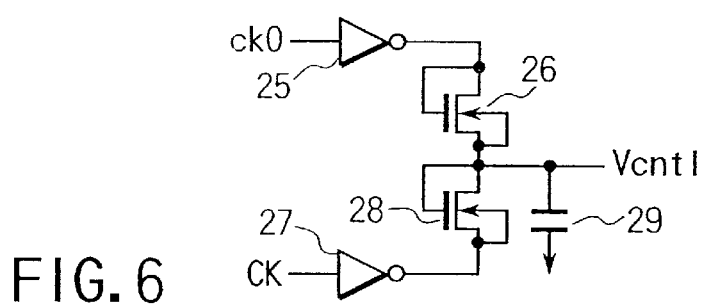
FIG. 6 is a circuit diagram of a circuit having functions of a frequency comparator and a control voltage generator, both employed in the data receiver depicted in FIG. 4.
Figure 7:
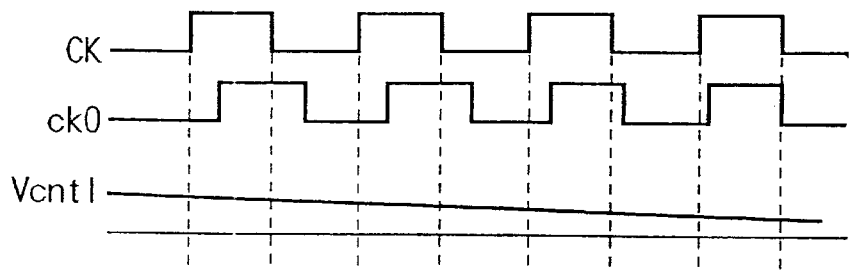
FIG. 7 is a timing chart of the circuit depicted in FIG. 6.

FIG. 6 shows a circuit that has functions of both the frequency comparator 14 and the control voltage generator 15 described above, and FIG. 7 is a timing chart of that circuit. In FIG. 6, an output the circuit receives from the stable clock generator 17 is denoted by CK, and a multiphase clock to be compared with that output by the frequency comparator 14 is indicated as ck0, which is one of the multiphase clocks that is numbered as "0". Needless to say, any multiphase clock can be used for comparison. Since each of the multiphase clocks generated by the voltage-controlled multiphase clock generator 16 has a duty of 50%, this characteristic is utilized for providing a simple circuit. That is, the frequency comparator 14 and the control voltage generator 15 are realized by one circuit. However, they may be attained by two separate circuits, as in an ordinary, phase locked loop (PLL) circuit.

The circuit shown in FIG. 6 comprises: an inverter 25 for inverting clock ck0; an N-channel MOS transistor 26 whose source (or drain) and gate are connected to the output node of the inverter 25; an inverter 27 for inverting clock CK; an N-channel MOS transistor 28 whose source (or drain) and back gate are connected to the output node of the inverter 27 and whose drain (or source) is connected to the drain (or source) of the N-channel MOS transistor 26; and a capacitor 29 connected between a ground voltage node and a node to which the MOS transistors 26 and 28 are connected in common.

With this configuration, the circuit compares the lengths of the half cycles of clocks ck0 and CK with each other. In accordance with the results of the comparison, control voltage Vcntl is generated from the node to which the capacitor 29 is connected. When clock ck0 is "L", an output of the inverter 25 is "H", and a current flows to the capacitor 29 by way of the MOS transistor 26. On the other hand, when clock CK is "H", an output of the inverter 27 is "L", and a current flows from the capacitor 29 by way of the MOS transistor 28. If the period of clock ck0 is short, the control voltage Vcntl lowers in level. Conversely, if it is long, the control voltage Vcntl rises in level.

If the control voltage Vcntl is low in level, the N-channel MOS transistor 24 of each of the signal inverters 21 of the voltage-controlled multiphase clock generator shown in FIG. 5A has a high resistance when it is in the conducting state. Since, in this case, the signal delay time of the signal inverter 21 increases, the oscillation frequency lowers. Conversely, if the control voltage Vcntl is high in level, the N-channel MOS transistor 24 of each of the signal inverters 21 of the voltage-controlled multiphase clock generator has a low resistance when it is in the conducting state. Since, in this case, the signal delay time of the signal inverter 21 decreases, the oscillation frequency rises.

Figure 8:
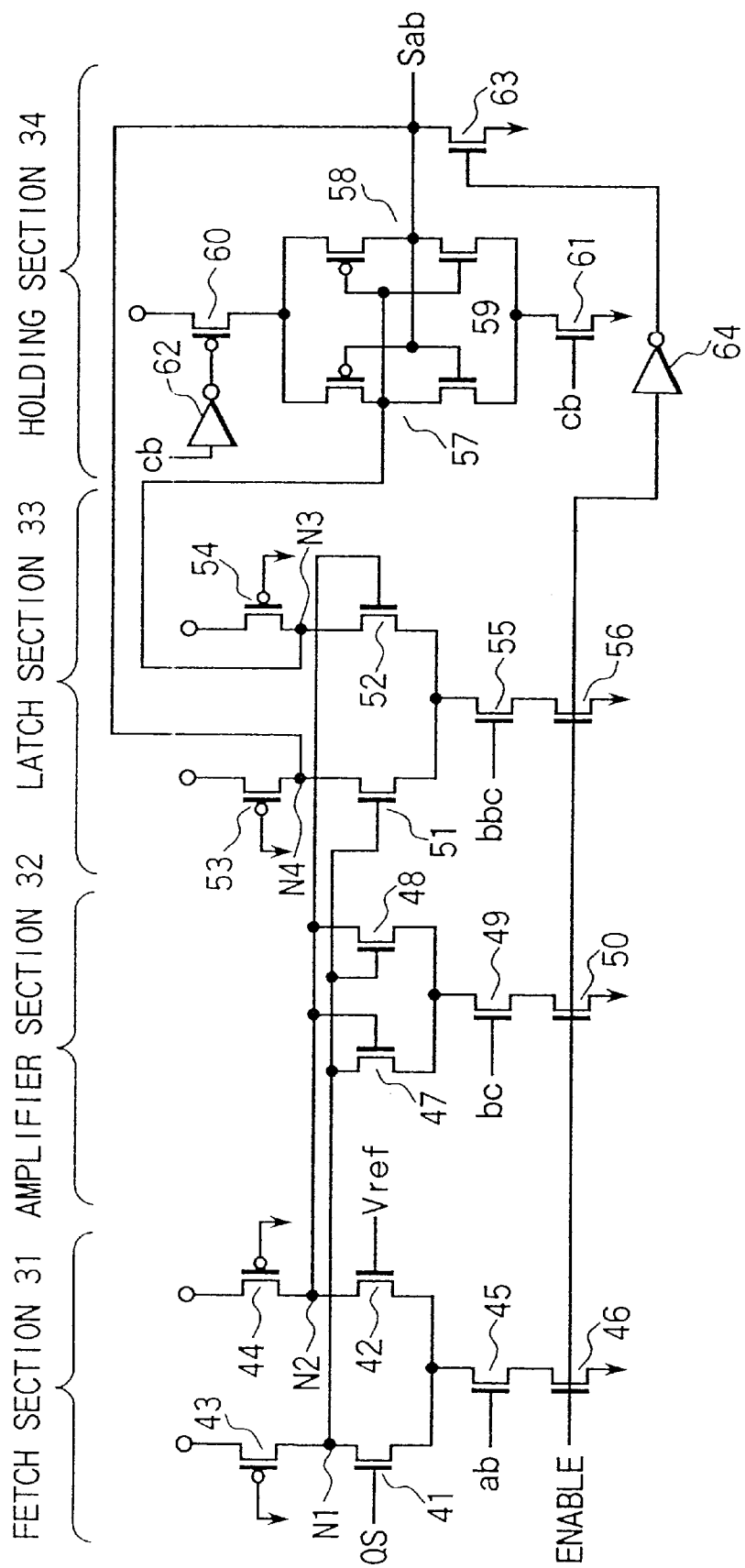
FIG. 8 is a circuit diagram showing a specific circuit configuration of an S receiver which is provided in the data receiver depicted in FIG. 4.

FIG. 8 shows a specific circuit configuration of the S receiver 11 depicted in FIG. 4. The S receiver 11 comprises a fetch section 31 for fetching a strobe signal QS, an amplifier section 32 for amplifying an output from the fetch section 31, a latch section 33 for latching an output of the amplifier section 32, and a holding section 34 for holding an output from the latch section 33.

The fetch section 31 is made up of N-channel MOS transistors 41 and 42, P-channel MOS transistors 43 and 44, and two N-channel MOS transistors 45 and 46 connected in series. The N-channel MOS transistors 41 and 42 jointly constitute a differential pair used for comparing the strobe signal QS with reference voltage Vref. The P-channel MOS transistors 43 and 44 are connected between the drains of the MOS transistors 41 and 42 and power supply voltage nodes. The P-channel MOS transistors 43 and 44 have their gates connected to a ground voltage node and therefore serve as loads. The two N-channel MOS transistors 45 and 46 are inserted between a ground voltage node and a node to which the sources of the MOS transistors 41 and 42 are connected. Control signal ab is supplied to the gate of MOS transistor 45, and the ENABLE signal described above is supplied to the gate of MOS transistor 46.

The amplifier section 32 is made up of an N-channel MOS transistor 47, an N-channel MOS transistor 48, and two N-channel MOS transistors 49 and 50 connected in series. The drain of the N-channel MOS transistor 47 is connected to the connection node N1 to which the MOS transistors 41 and 43 of the fetch section 31 are connected. The gate of the N-channel MOS transistor 47 is connected to the connection node N2 to which the MOS transistors 42 and 44 of the fetch section 31 are connected. The gate of the MOS transistor 48 is connected to the connection node N1 of the fetch section 31, the drain thereof is connected to the connection node N2 of the fetch section 31, and the source thereof is connected to the source of the MOS transistor 47. The two N-channel MOS transistors 49 and 50 are inserted between a ground voltage node and a node to which the sources of the MOS transistors 47 and 48 are connected. Control signal bc is supplied to the gate of MOS transistor 49, and the ENABLE signal is supplied to the gate of MOS transistor 50.

The latch section 33 is made up of an N-channel MOS transistor 51, an N-channel MOS transistor 52, P-channel MOS transistors 53 and 54, and two N-channel MOS transistors 55 and 56 connected in series. The gate of the N-channel MOS transistor 51 is connected to the connection node N1 of the fetch section 31. The gate of the MOS transistor 52 is connected to the connection node N2 of the fetch section 31, and the source thereof is connected to the source of the MOS transistor 51. The P-channel MOS transistors 53 and 54 are connected between power supply voltage nodes and the drains of the MOS transistors 51 and 52. The P-channel MOS transistors 53 and 54 have their gates connected to a ground voltage node and therefore serve as loads. The N-channel MOS transistors 55 and 56 are inserted between a ground voltage node and a node to which the sources of the MOS transistors 51 and 52 are connected. Control signal bbc is supplied to the gate of MOS transistor 55, and the ENABLE signal is supplied to the gate of MOS transistor 56.

The holding section 34 is made up of a flip-flop 59, a P-channel MOS transistor 60, an N-channel MOS transistor 61, an inverter 62, an N-channel MOS transistor 63, and an inverter 64. The flip-flop 59 comprises complementary metal oxide semiconductor (CMOS) inverters 57 and 58 that are made of P-channel and N-channel MOS transistors, and the input and output nodes of one of the inverters are connected to the output and input nodes of the other inverter, respectively. The P-channel MOS transistor 60 is connected between a power supply voltage node and a node to which the sources of the P-channel MOS transistors of the CMOS inverters 57 and 58 are connected. The N-channel MOS transistor 61 is connected between a ground voltage node and a node to which the sources of the N-channel MOS transistors of the CMOS inverters 57 and 58 are connected. The output node of the inverter 62 is connected to the gate of the P-channel MOS transistor 60. The N-channel MOS transistor 63 is connected between a ground voltage node and the output node of the CMOS inverter 58. The output node of the inverter 64 is connected to the gate of the MOS transistor 63. A signal appearing at the connection node N3 between the MOS transistors 52 and 54 of the latch section 33 and a signal appearing at the connection node N4 between the MOS transistors 51 and 53 are supplied to the input nodes of the CMOS inverters 57 and 58. Control signal cb is supplied to the gate of the MOS transistor 61 and to the inverter 62. The ENABLE signal is supplied to the inverter 64.

The symbols a, b and c used in "control signals ab, bc, bbc and cb" to be supplied to the S receiver shown in FIG. 8 denote the number of the clocks generated by the stable multiphase clock generator. The clock corresponding to "b" is one level higher than the clock corresponding to "a", and the clock corresponding to "c" is one level higher than the clock corresponding to "b". The control signals ab, bc, bbc and cb are specifically pulse signals that rise only during the time interval in which there is a predetermined phase difference between the multiphase clocks described above. A method in which to generate the control signals will be described later.

The S receiver described above operates as below. In the case where control signal ab becomes "H" when the ENABLE signal is "H", the fetch section 31 operates, and the strobe signal QS is fetched by the fetch section 31. When the strobe signal QS is "H", the signal at the connection node N2 is "H" and the signal at the connection node N1 is "L".

When control signal bc becomes "H", thereafter, the amplifier section 32 operates, and a signal from the fetch section 31 is amplified by the amplifier section 32.

When control signal bbc becomes "H", the latch section 33 operates, and an output from the amplifier section 32 is latched by the latch section 33.

When control signal cb becomes "H", the holding section 34 operates, and the signal latched by the latch section 33 is held by the holding section 34. Signal Sab is output from the holding section 34.

The S receiver has to be set in the operating condition after the level of the strobe signal QS becomes definite. If the S receiver is not set in the operating condition in this manner, it cannot utilize the strobe signal QS as a timing signal for fetching data, even when its level becomes definite. Hence, it would be ideal if the ENABLE signal would be used as follows. That is, a clock supplied from the controller to a DIMM to output data in a given cycle is used as a reference clock, and the S receiver is set in the operating condition by controlling the ENABLE signal to become "H" a predetermined time after the supply of the reference clock. To stop the operation, the ENABLE signal has to be set at "L", and the timing to control the ENABLE signal to become "L" can be based on an actuation signal of the D receiver. To be more specific, when the receiver of the controller has received burst data (i.e., consecutive data), the strobe signal QS corresponding to the last item of the burst data varies, producing an actuation signal of the D receiver. Based on this actuation signal, the timing which is after the data fetching by the D receiver is selected from the timings of the multiphase clocks. If the ENABLE signal is used in this manner, the S receiver can be actuated only during the interval in which the level of the strobe signal QS corresponding to predetermined burst data reception interval is definite. Since the strobe signal QS is "L" immediately before the reception of burst data and begins to rise at a time corresponding to the head data of the burst data, the output signal Sab has to be set at "L" when the ENABLE signal is "L". This is realized when the MOS transistor 63 of the holding section 34 is in the conducting state.

FIGS. 9A through 9D show a specific example of a circuit used for generating the control signals ab, bc, bbc and cb used in the S receiver depicted in FIG. 8.

FIG. 9A shows a control signal generating circuit which generates control signal ab based on clocks cka and ckb mentioned above. This circuit is made up of an inverter 71 which inverts clock ckb, and an AND gate 72 which is supplied with clock cka and an output of the inverter 71.

FIG. 9B shows a control signal generating circuit which generates control signal bc based on clocks ck[c+(2n+1)] and ck[b+2n]. This circuit is made up of an inverter 73 which inverts clock ck[b+2n], and an AND gate 74 which is supplied with clock ck[c+(2n+1)] and an output of the inverter 73.

FIG. 9C shows a control signal generating circuit which generates control signal cb based on clocks ckb and ckc. This circuit is made up of an inverter 75 which inverts clock ckb, and an OR gate 76 which is supplied with clock ckc and an output of the inverter 75.

FIG. 9D shows a control signal generating circuit which generates control signal bbc based on clock ckb and control signal bc output from the circuit shown in FIG. 9B. The control signal generating circuit is constituted by an AND gate 77 which is supplied with clock ckb and control signal bc.

Figure 10:
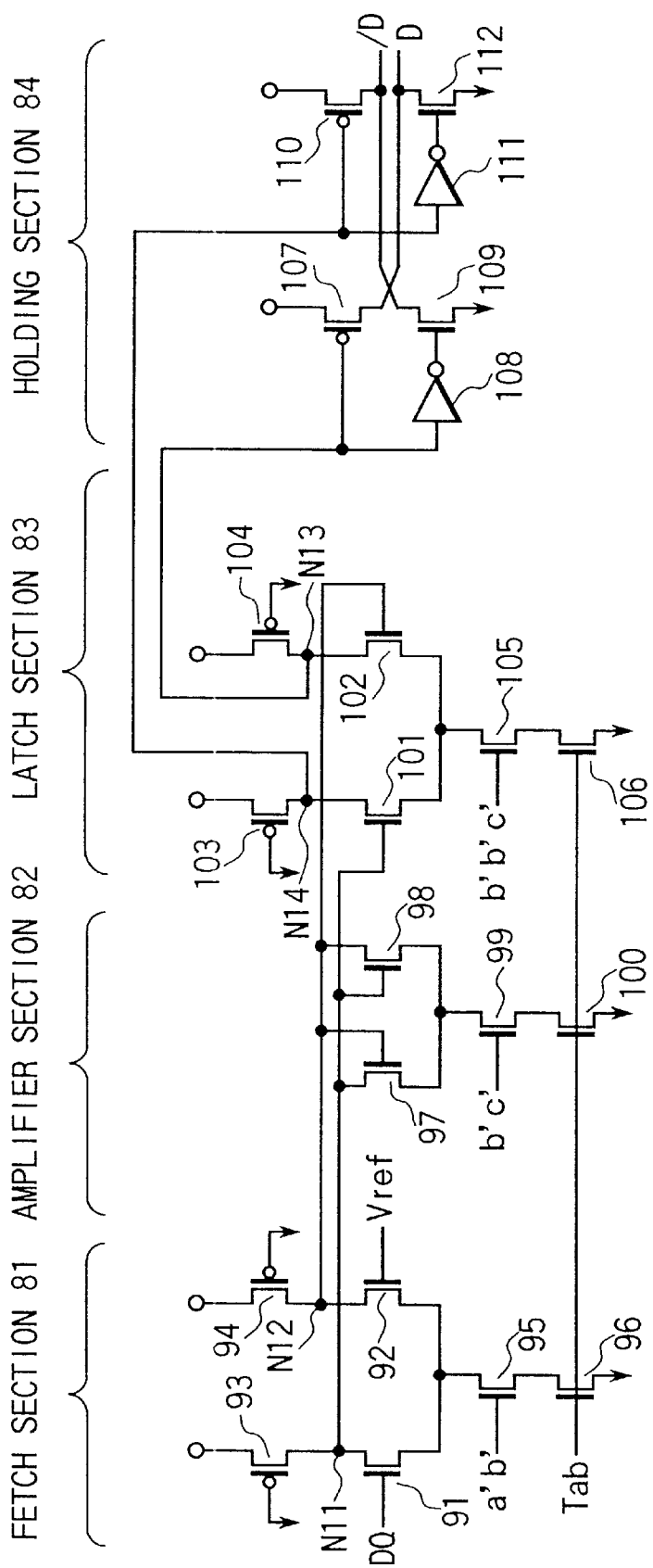
FIG. 10 is a circuit diagram showing a specific circuit configuration of a D receiver which is provided in the data receiver depicted in FIG. 4.

FIG. 10 shows a specific circuit configuration of the D receiver 12 depicted in FIG. 4. The D receiver 12 is substantially similar in circuit configuration to the S receiver shown in FIG. 8 and comprises a fetch section 81 for fetching data DQ, an amplifier section 82 for amplifying an output from the fetch section 81, a latch section 83 for latching an output of the amplifier section 82, and a holding section 84 for holding an output from the latch section 83.

The fetch section 81 is made up of N-channel MOS transistors 91 and 92, P-channel MOS transistors 93 and 94, and two N-channel MOS transistors 95 and 96 connected in series. The N-channel MOS transistors 91 and 92 jointly constitute a differential pair used for comparing the data DQ with reference voltage Vref. The P-channel MOS transistors 93 and 94 are connected between the drains of the MOS transistors 91 and 92 and power supply voltage nodes. The P-channel MOS transistors 93 and 94 have their gates connected to a ground voltage node and therefore serve as loads. The two N-channel MOS transistors 95 and 96 are inserted between a ground voltage node and a node to which the sources of the MOS transistors 91 and 92 are connected. Control signal a'b' is supplied to the gate of MOS transistor 95, and control signal Tab is supplied to the gate of MOS transistor 96.

The amplifier section 82 is made up of an N-channel MOS transistor 97, an N-channel MOS transistor 98, and two N-channel MOS transistors 99 and 100 connected in series. The drain of the N-channel MOS transistor 97 is connected to the connection node N11 to which the MOS transistors 91 and 93 of the fetch section 81 are connected. The gate of the N-channel MOS transistor 97 is connected to the connection node N12 to which the MOS transistors 92 and 94 of the fetch section 81 are connected. The gate of the N-channel MOS transistor 98 is connected to the connection node N11 of the fetch section 81, the drain thereof is connected to the connection node N12 of the fetch section 81, and the source thereof is connected to the source of the MOS transistor 97. The two N-channel MOS transistors 99 and 100 are inserted between a ground voltage node and a node to which the sources of the MOS transistors 97 and 98 are connected. Control signal b'c' is supplied to the gate of MOS transistor 99, and control signal Tab is supplied to the gate of MOS transistor 100.

The latch section 83 is made up of an N-channel MOS transistor 101, an N-channel MOS transistor 102, P-channel MOS transistors 103 and 104, and two N-channel MOS transistors 105 and 106 connected in series. The gate of the N-channel MOS transistor 101 is connected to the connection node N11 of the fetch section 81. The gate of the MOS transistor 102 is connected to the connection node N12 of the fetch section 81, and the source thereof is connected to the source of the MOS transistor 101. The P-channel MOS transistors 103 and 104 are connected between power supply voltage nodes and the drains of the MOS transistors 101 and 102. The P-channel MOS transistors 103 and 104 have their gates connected to a ground voltage node and therefore serve as loads. The N-channel MOS transistors 105 and 106 are inserted between a ground voltage node and a node to which the sources of the MOS transistors 101 and 102 are connected. Control signal b'b'c' is supplied to the gate of MOS transistor 105, and control signal Tab is supplied to the gate of MOS transistor 106.

The holding section 84 is made up of a P-channel MOS transistor 107, an inverter 108, an N-channel MOS transistor 109, a P-channel MOS transistor 110, an inverter 111, and an N-channel MOS transistor 112. The source of the P-channel MOS transistor 107 is connected to a power supply voltage node, the drain thereof is connected to a data bus D, and the gate thereof is connected to a connection node N13 to which the MOS transistors 102 and 104 of the latch section 83 are connected. The inverter 108 is used for inverting a signal appearing at the node N13. The source of the N-channel MOS transistor 109 is connected to a ground potential node, the drain thereof is connected to a data bus /D, and the gate thereof is connected to the output node of the inverter 108. The source of the P-channel MOS transistor 110 is connected to a power supply voltage node the, the drain thereof is connected to the data bus /D, and the gate thereof is connected to a connection node N14 to which the MOS transistors 101 and 103 of the latch circuit 83 are connected. The inverter 111 is used for inverting a signal appearing at the node N14. The source of the N-channel MOS transistor 112 is connected to a ground voltage node, the drain thereof is connected to the data bus D, and the gate thereof is connected to an output node of the inverter 111.

The D receiver described above operates as below. In the case where control signal a'b' becomes "H" when the control signal Tab is "H", the fetch section 81 operates, and the data DQ from a DIMM is fetched by the fetch section 81. When the data DQ is "H", the signal at the connection node N12 is "H" and the signal at the connection node N11 is "L".

When control signal b'c' becomes "H" thereafter, the amplifier section 82 operates, and a signal from the fetch section 81 is amplified by the amplifier section 82.

When control signal b'b'c' becomes "H", the latch section 83 operates, and an output from the amplifier section 82 is latched by the latch section 83.

An output from the latch section 83 is supplied to the holding section 84, where it is held. Subsequently, the held data is output to the data buses D and /D. When data is held by the receiver, the data buses D and /D are in a low-impedance state and therefore allows transmission of data. When control signal b'b'c' is "L", the receiver is reset, and the data buses D and /D are in a high-impedance state.

The meanings of symbols a', b' and c' used in "control signals a'b', b'c', b'b'c' and c'b'" supplied to the D receiver correspond to those of the symbols a, b and c, respectively. It should be noted that signals a', b', and c' lag signals a, b and c, respectively, by a predetermined delay time δ. The delay time δ is determined based on the time for which the D receiver shown in FIG. 10 can delay fetching data after the generation of the strobe signal QS. Although the delay time can be determined in consideration of an optimum margin for each system, it is automatically determined once the design of the system is determined. Like control signals ab, bc, bbc and cb, control signals a'b', b'c', b'b'c' and c'b' are pulse signals that rise only during the time interval in which there is a predetermined phase difference between the multiphase clocks described above. A method in which to generate the control signals will be described later.

Control signal Tab is a signal having a similar function to that of the ENABLE signal used in the S receiver. Control signal Tab is derived from signals Sab and Sbc which are output from the adjacent S receivers. Control signal Tab can be produced from signals Sab and Sbc in two ways, depending upon the manner in which variations in the strobe signal QS are utilized. When the strobe signal QS of each data varies, both the rise and fall of the strobe signal QS can be utilized for transferring data. In other words, the data can be transferred in synchronism with the rise and fall of the strobe signal QS. In contrast, where only the rise of the strobe signal is used for determining the timing of data transfer, it is necessary to detect only the rise of the strobe signal QS.

FIG. 11A shows a control signal generating circuit for producing control signal Tab by utilization of both the rise and fall of the strobe signal QS. This circuit is made of an exclusive-OR gate 121 that is supplied with signals Sab and Sbc.

FIG. 11B shows a control signal generating circuit for producing control signal Tab by utilization of only the rise of the strobe signal QS. This circuit is made up of an inverter 122 which inverts signal Sab, and an AND gate 123 which is supplied with both an output of the inverter 122 and signal Sbc.

FIGS. 12A through 12C show a specific example of a circuit used for generating the control signals a'b', b'c', b'b'c' and c'b' used in the S receiver depicted in FIG. 10.

FIG. 12A shows a control signal generating circuit which generates control signal alb, based on clocks ck[a+δ] and ck[b+δ], which lag clocks cka and ckb by a delay time of δ, respectively. This circuit is made up of an inverter 125 which inverts clock ck[b+δ], and an AND gate 126 which is supplied with clock ck[a+δ] and an output of the inverter 125.

FIG. 12B shows a control signal generating circuit which generates control signal b'c' based on clocks ck[c+(2n+1)+δ] and ck[b+2n+δ], which lag clocks ck[c+(2n+1)] and ck[b+2n] by a delay time of δ, respectively. This circuit is made up of an inverter 127 which inverts clock ck[b+2n+δ], and an AND gate 128 which is supplied with clock ck[c+(2n+1)+δ] and an output of the inverter 127.

FIG. 12C shows a control signal generating circuit which generates control signal b'b'c' based on control clocks b'c' and ck[b+δ] output from the control signal generating circuit depicted in FIG. 12B. The control signal generating circuit is constituted by an AND gate 129 which is supplied with clocks b'c' and ck[b+δ].

Figure 13:
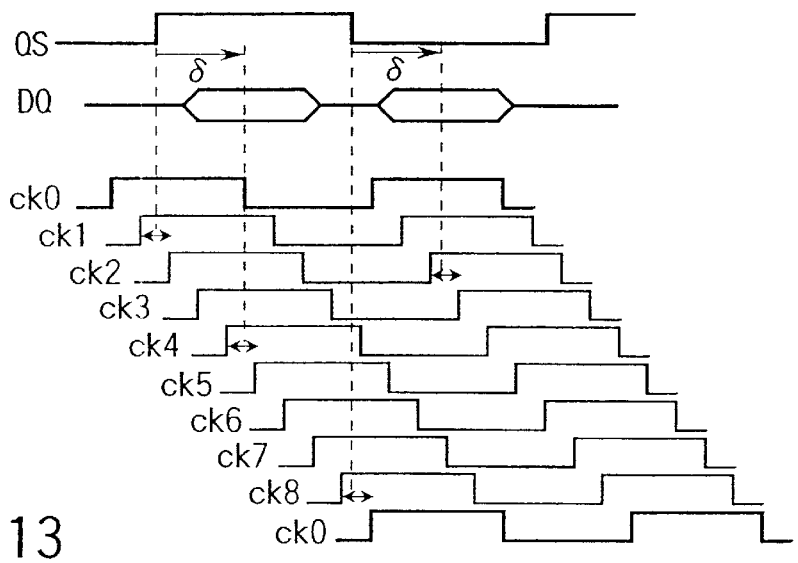
FIG. 13 is a timing chart showing how multiphase clocks, a strobe signal QS and data DQ are related to one another in the data receiver depicted in FIG. 4.

FIG. 13 is a timing chart showing how nine multiphase clocks ck0–ck8 generated by the stable multiphase clock generator 13, a strobe signal QS and data DQ are related to one another in the data receiver depicted in FIG. 4. In the timing chart shown in FIG. 13, the delay time 6 corresponds to four clocks.

The first data DQ in FIG. 13 is fetched by the D receiver activated by T80 (a=8, b=0). The first data is kept fetched between the timing of multiphase clock ck1 at which the S receiver that generates signal S12 (a=1, b=1) detects a variation in the strobe signal QS and the timing of multiphase clock ck4 which is the third one from multiphase clock ck1. The second data DQ in FIG. 13 is fetched by the D receiver activated by T78 (a=7, b=8). The second data is kept fetched between the timing of multiphase clock ck8 at which the S receiver that generates signal S80 (a=8, b=0) detects a variation in the strobe signal QS and the timing of multiphase clock ck2 which is the third one from multiphase clock ck8. As can be seen from this, the relationships among the clocks in the D receiver are based on the delay time δ that is determined by the sum of the rise times of four clocks.

FIGS. 14A–14F show a control signal generating circuit for producing control signals used in the D receiver in a case where only the rise of the strobe signal QS is utilized. For the purpose of simplicity, FIGS. 14A–14F illustrate the case where D receivers are driven at different timings determined from the rise of the strobe signal QS. The timings at which to drive the D receivers are indicated by i in FIGS. 14A–14F.

Figure 14A:
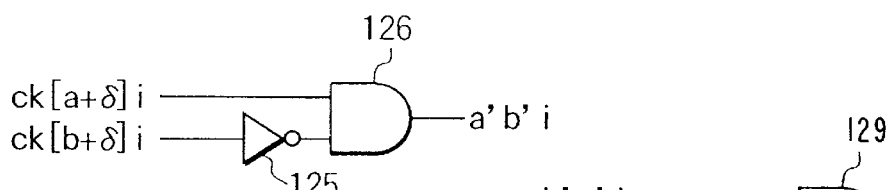
FIGS. 14A through 14F are circuit diagrams showing another specific configuration of a D receiver which is provided in the data receiver depicted in FIG. 4.

FIG. 14A shows a control signal generating circuit for generating signal a'b' i corresponding to control signal a'b' shown in FIG. 12A at the respective timings. Like the circuit in FIG. 12A, the circuit is made up of an inverter 125 and an AND gate 126.

Figure 14C:
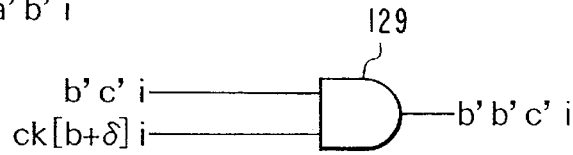
Figure 14B:
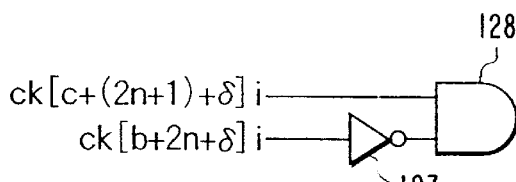

FIG. 14B shows a control signal generating circuit for generating signals b'c' i corresponding to control signal b'c' shown in FIG. 12B at the respective timings. Like the circuit in FIG. 12B, the circuit is made up of an inverter 127 and an AND gate 128.

FIG. 14C shows a control signal generating circuit for generating signals b'b'c' i corresponding to control signal b'b'c' shown in FIG. 12C at the respective timings. Like the circuit in FIG. 12C, the circuit is constituted by an AND gate 129.

Figure 14D:
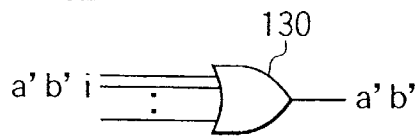
Figure 14F:
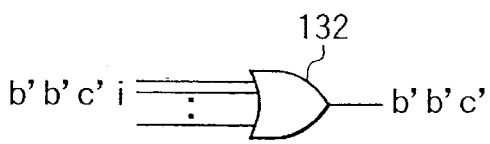
Figure 14E:
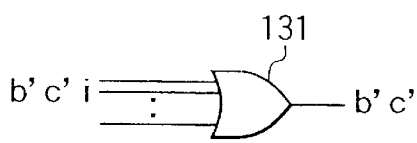

Control signal a'b' is an output of the OR gate 130 shown in FIG. 14D, and the OR gate 130 receives all signals a'b'i that are generated by the circuits of the configuration shown in FIG. 14A, and outputs a logical OR of the received signals. Control signal b'c' is an output of the OR gate 131 shown in FIG. 14E, and the OR gate 131 receives all signals b'c'i that are generated by the circuits of the configuration shown in FIG. 14B, and outputs a logical OR of the received signals. Control signal b'b'c' is an output of the OR gate 132 shown in FIG. 14F, and the OR gate 132 receives all signals b'b'c' i that are generated by the circuits of the configuration shown in FIG. 14C, and outputs a logical OR of the received signals.

The control signal generating circuits shown in FIGS. 14A–14F determine δi at the respective timings, and generate control signals a'b'i, b'c'i and b'b'c'i that correspond to control signals a'b', b'c' and b'b'c' generated by the control signal generating circuits shown in FIGS. 12A–12C at the respective timings. OR signals of the control signals a'b'i, b'c'i and b'b'c'i are output as control signals a'b', b'c' and b'b'c'.

Figure 15:
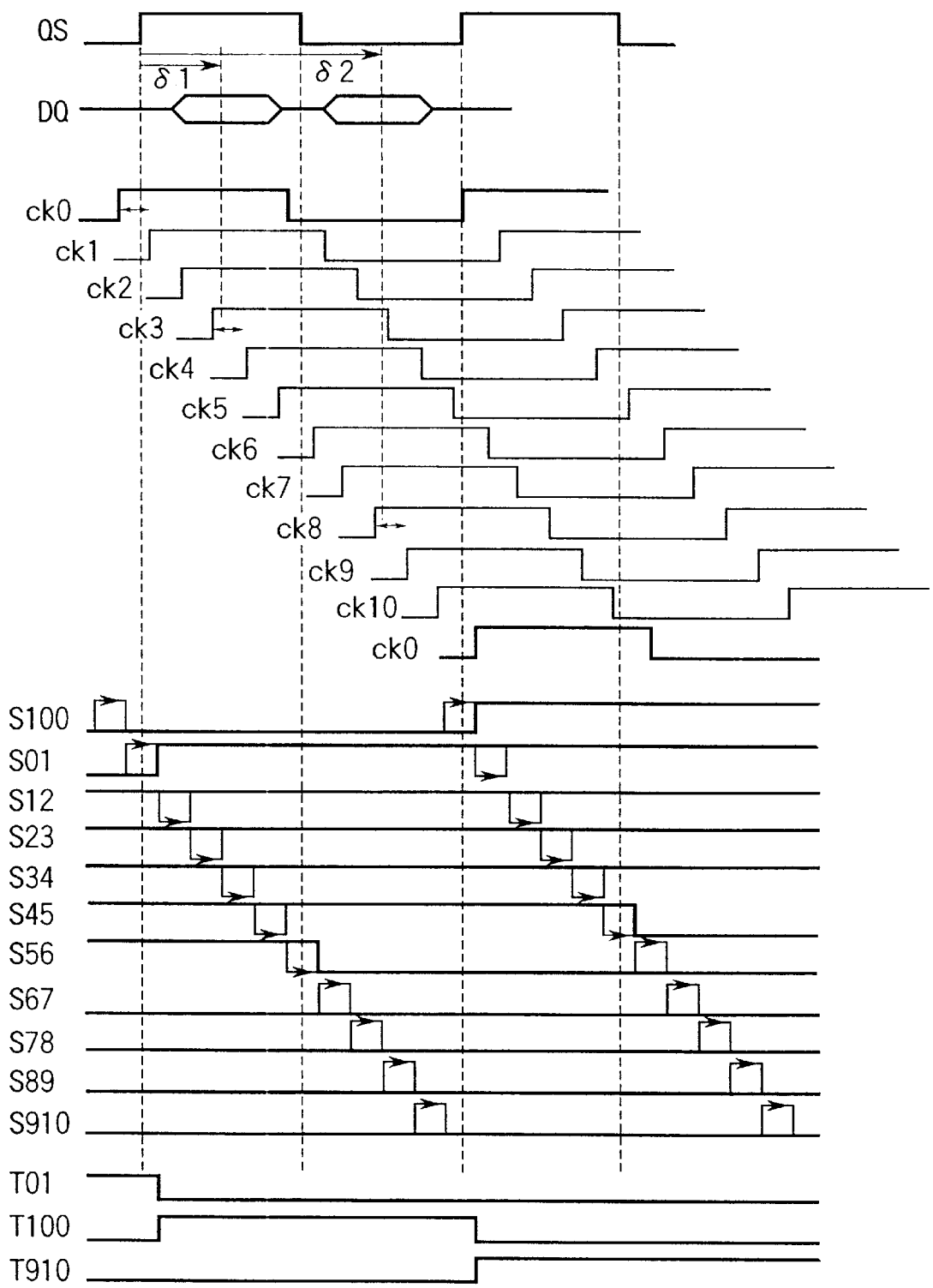
FIG. 15 is a timing chart showing the case where the data receiver depicted in FIG. 4 uses eleven multiphase clocks ck0–ck10 and utilizes only the rise of the strobe signal QS, and illustrating how the clocks ck0–ck10, a strobe signal QS and data DQ are related to one another.

FIG. 15 is a timing chart showing how eleven multiphase clocks ck0–ck10 generated by the stable multiphase clock generator 13, a strobe signal QS and data DQ are related to one another in the data receiver depicted in FIG. 4. The timing chart in FIG. 15 illustrates the case where only the rise of the strobe signal QS is used.

In the timing chart in FIG. 15, the value of i described above is 2, and clocks 3 and 8 correspond to the timings at which data is fetched. The value of δ is based on the timing at which the strobe signal QS rises. The delay time δ1 is the time which is before the timing at which data is fetched first, and this delay time corresponds to the sum of the delays of the rise times of four clocks. The delay time δ2 is the time which is before the timing at which data is fetched next, and this delay time corresponds to the sum of the delays of the rise times of nine clocks, measured from the rise timing of the strobe signal QS.

The first data DQ in FIG. 15 is fetched by the D receiver activated by T100 (a=10, b=0). The first data is kept fetched between the timing of multiphase clock ck0 at which the S receiver that generates signal S01 (a=0, b=1) detects a variation in the strobe signal QS and the timing of multiphase clock ck3 which is the third one from multiphase clock ck0. The second data DQ in FIG. 13 is also fetched by the D receiver, and is kept fetched between the timing of multiphase clock ck0 and the timing of multiphase clock ck8 which is the eighth one from multiphase clock ck0.

In the D receiver, δ1 is 4, and δ2 is 9. It should be noted that the states of output signals Sab from the S receivers and the states of signals Tab used for activating the D receivers are also illustrated in FIG. 15. In the timing chart in FIG. 15, the square and arrow attached to each signal Sab (S100 to S910) represent the times during which the S receivers fetch states of QS. As can be seen from the timing chart shown in FIG. 15, the control signals Tab used for driving the D receivers are "H" only after QS rises. The D receiver used for fetching the two pieces of data shown in FIG. 15 is the one identified by T100.

Figure 16:
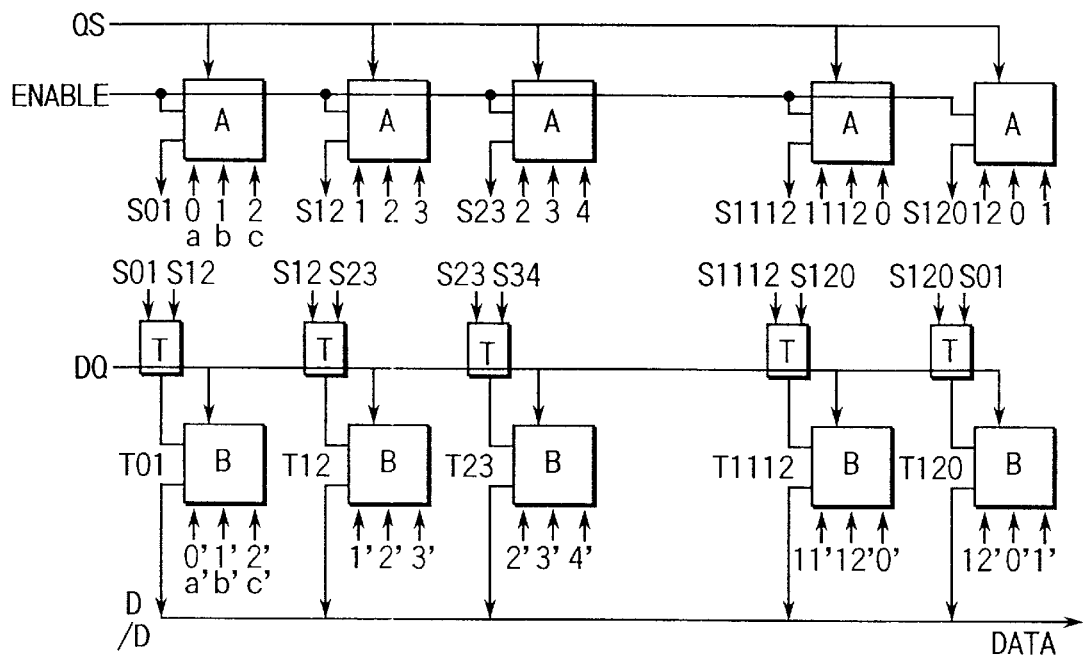
FIG. 16 is a circuit diagram showing in more detail how the S receiver and the D receiver are related to each other in the data receiver depicted in FIG. 4.

FIG. 16 is a circuit diagram showing in more detail how the S receiver and the D receiver are related to each other in the data receiver depicted in FIG. 4. In the circuit shown in FIG. 16, thirteen clocks ck0 to ck12 are used as the multiphase clocks. Therefore, the S receiver and the D receiver employs thirteen circuit units A shown in FIG. 8 or circuit units B shown in FIG. 10. Signal Tab, used in place of the ENABLE signal in each circuit unit B, is produced by a circuit unit T. This circuit unit T corresponds to the exclusive-OR gate 121 shown in FIG. 11A, or the circuit which is made up of the inverter 122 and AND gate 123 shown in FIG. 11B. The number of circuit units T provided is thirteen, which number is equal to the number of circuit units B provided.

As described above, the ENABLE signal becomes "H" immediately before the transfer of burst data and becomes "L" immediately thereafter, and thus serves to activate the entire S receiver. When all circuit units that are included in the S receiver are activated, a variation in the strobe signal QS can be monitored by each circuit unit A.

Each circuit unit A is controlled by five multiphase clocks. As indicated in the illustration of each control signal generating circuit, the clocks supplied to circuit unit A and used as reference clocks are limited to three, namely, clocks cka, ckb and ckc. The remaining two clocks, namely ck[c+(2n+1)] and ck[b+2n], are determined by the total number (4n+1) of the multiphase clocks. In FIG. 16, therefore, each circuit unit A is illustrated as being supplied with three clocks a, b and c. Each circuit unit A monitors the level of the strobe signal QS, and holds two clocks that rise earlier than the others among the clocks supplied thereto. In other words, signals Sab (a,b=0,1,2) of clocks having the smallest two numbers are held and output. Since each circuit unit A monitors the strobe signal QS after a delay time corresponding to the phase difference of the multiphase clocks, each output signal Sab is stored, with the variation in the strobe signal QS being associated with the position of the circuit unit A.

Each of the circuit units T serves to locate the position where the signal Sab varies. The circuit configuration of each circuit unit T is shown in FIGS. 11A and 11B. The output signal Tab of each circuit unit T becomes "H" only when a variation in the strobe signal QS, i.e., a variation in signal Sab, is detected. When signal Sab that becomes "H" is supplied to circuit unit T, the corresponding circuit unit B of the D receiver is activated.

Like the case of circuit units A, each of the circuit units B of the D receiver is controlled on the basis of five multiphase clocks. As indicated in the illustration of each control signal generating circuit in FIGS. 14A–14F, the clocks supplied to circuit unit B and used as reference clocks are limited to three, namely, clocks ck[a+δ], ck[b+δ] and ck[c+δ]. The remaining two clocks, namely ck[c+(2n+1)+δ] and ck[b+2n+δ)], are determined by the total number (4n+1) of the multiphase clocks. In FIG. 16, therefore, each circuit unit B is illustrated as being supplied with three clocks a', b' and c'.

Only one of the thirteen circuit units B is activated in response to the signal Tab supplied from the corresponding circuit unit T. The activated circuit unit B fetches the data DQ and outputs data to the buses D and /D at the timing of the supplied multiphase clocks.

Figure 17:
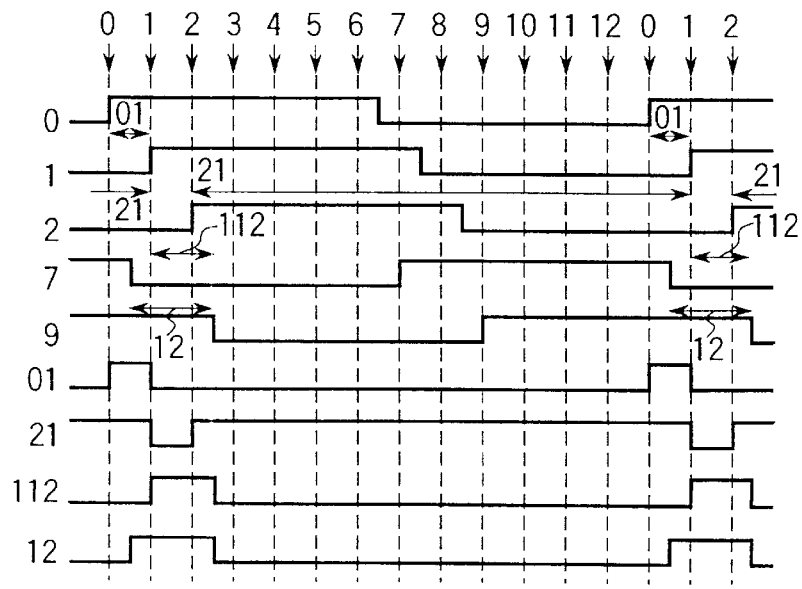
FIG. 17 is a timing chart showing in detail the control signals to be used in a given circuit unit A, which is one of a plurality of circuit units A included in the S receiver depicted in FIG. 16.

FIG. 17 is a timing chart showing in detail the control signals to be used in the circuit unit A that is one of the circuit units A of the S receiver and outputs signal S01 (a=0, b=1), i.e., the circuit unit A depicted at the left end of FIG. 16. In the timing chart, the clocks used as reference clocks are ck0, ck1 and ck2, and these clocks are indicated only with their numbers. Since the total number (4n+1) of multiphase clocks is 13, n=3 in the case shown in FIG. 17. Since the value of c+(2n+1) is 9 (=2+7) and the value of b+2n is 7 (=1+6), the remaining two clocks are ck7 and ck9. These five clocks, which are outputs from the circuits made of the 13-stage ring oscillator shown in FIG. 5A, are indicated in FIG. 17, along with control signals ab, bc, cb and bbc which are produced by use of the clocks. The arrows in FIG. 17 indicate the time intervals during which control signals ab(=01), bc(=12), cb(=21) and bbc(=112) are in the "H" level.

From the states of control signals 01, 21, 112 and 12, it can be easily seen that the states of QS change as if the circuit unit A fetches, amplifies, latches and holds strobe signal QS.

FIGS. 18A through 18D show specific configurations of control signal generating circuits which generate the control signals ab, bc, cb and bbc described above. The circuit configurations in FIGS. 18A–18D are similar to those shown in FIGS. 9A–9D, respectively. FIGS. 18A–18D differ from FIGS. 9A–9D in that specific clock numbers are indicated.

As detailed above, the data receiver employed in the above embodiment is featured in that multiphase clocks are utilized to enable the controller to optimally determine the fetch timings of the strobe signal QS and data DQ. Since the strobe signal QS and data DQ are fetched at the timings determined in this manner, the data can be transferred from the memory module to the controller. To be more specific, even if the data is transferred without reference to the system clocks due to the irregular flight times, the controller can determine optimal data fetch timings.

A description will now be given of the second embodiment of the present invention. In the first embodiment described above, the data receiver of the controller is designed such that the D receiver is made up of a large number of circuit units, and each of these circuit units is driven based on multiphase clocks. The second embodiment differs from the first embodiment in that the D receiver is constituted by a single circuit unit.

FIGS. 19A and 19B show configurations of control signal generating circuits each of which is applied to the case where the D receiver is constituted by a single circuit unit.

The control signal generating circuit shown in FIG. 19A generates control signal tab that is synchronous with signal Tab generated by the circuit shown in FIG. 11A or FIG. 11B. The circuit shown in FIG. 19A is made up of a delay circuit 141 for delaying signal Tab, an inverter 142 for inverting an output from the delay circuit 141, and an AND gate 143, supplied with an output from the inverter 142 and signal Tab, for outputting control signal tab. The pulse width of this control signal Tab is determined by the delay time provided by the delay circuit 141.

The control signal generating circuit shown in FIG. 19B receives a number of control signals tab generated by a number of control signal generating circuits, each of which has a circuit configuration as is shown in FIG. 19A. Upon receipt of the control signals tab, the circuit shown in FIG. 19B generates control signals A, B and C used for controlling the single circuit unit constituting the D receiver. The circuit shown in FIG. 19B is made up of an OR gate 144 which receives a number of control signals tab, and three delay circuits 145, 146 and 147 which receive an output from the OR gate 144 and provide different delay times δ, δ' and δ", respectively. Control signals A, B and C are produced as outputs of delay circuits 145, 146 and 147, respectively. Delay time δ used in the second embodiment is equal in length to time δ used in the first embodiment.

Figure 20:
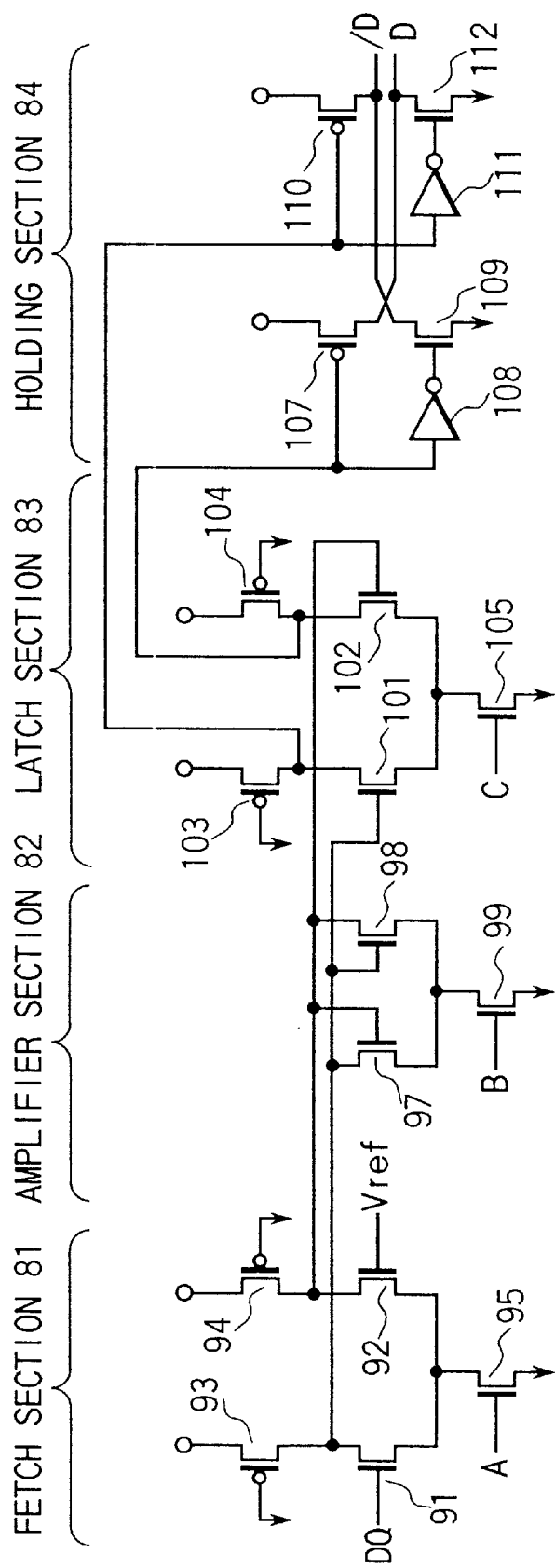
FIG. 20 is a circuit diagram of the D receiver used in the data receiver employed in the second embodiment of the present invention.

FIG. 20 shows a circuit configuration of a D receiver. In the case of the second embodiment, the D receiver is constituted by a single circuit unit. The circuit shown in FIG. 20 differs from that shown in FIG. 10 in the following three points: (i) the source of transistor 95 of the fetch section 81 is connected directly to a ground voltage node, not through transistor 96 mentioned above, and the gate of transistor 95 is supplied with control signal A produced by the circuit shown in FIG. 19B, instead of control signal a'b' mentioned above; (ii) the source of transistor 99 of the amplifier section 82 is connected directly to a ground voltage node, not through transistor 100 mentioned above, and the gate of transistor 99 is supplied with control signal B produced by the circuit shown in FIG. 19B, instead of control signal b'c' mentioned above; and (iii) the source of transistor 105 of the latch section 83 is connected directly to a ground voltage node, not through transistor 106 mentioned above, and the gate of transistor 105 is supplied with control signal C produced by the circuit shown in FIG. 19B, instead of control signal b'b'c' mentioned above.

The D receiver of the above configuration operates in a basically similar manner to that of the D receiver of the first embodiment, but is somewhat disadvantageous in the following two points: (i) control signals A, B and C used for controlling the operation of the D receiver are not delayed based on multiphase clocks, and the data fetch timings become irregular more or less; and (ii) due to the repeated use of the single D receiver, the receiver cannot be reset at such short intervals as to cope with a short processing cycle of data DQ, with the result that the data transfer period may be longer than that of the first embodiment. In spite of these disadvantages, however, the second embodiment enables remarkable simplification of the circuit configuration required, since the D receiver is constituted by a single circuit unit. Accordingly, the second embodiment is very useful unless it is applied to the case where the processing cycle of data DQ is extremely short.

As described above, according to the present invention, it is possible to accurately control or determine the data fetch timing even if data are transferred from the memory module to the controller without reference to the system clocks due to the irregular flight times.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data receiver for use in a system wherein data transfer is performed based on data and strobe signals which are supplied to the system almost simultaneously with the data, said data receiver comprising:
   a plurality of first receivers, driven at predetermined time intervals, for receiving the strobe signals; and
   at least one second receiver, driven based on outputs from the first receivers, for receiving and transferring the data.

2. A data receiver according to claim 1, wherein said first receivers are controlled for burst data transfer such that the first receivers are set in an active state immediately before a strobe signal corresponding to a start item of burst data rises, and are set in an inactive state after a last item of the burst data is received.

3. A data receiver for use in a system wherein data transfer is performed based on data and strobe signals which are supplied to the system almost simultaneously with the data and represent time positions of the data, said receiver comprising:
   a multiphase clock generator for generating a plurality of multiphase clocks which have predetermined phase differences and are equal in period;
   a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;
   a second receiver which responds to actuating signals and receives the data; and
   a circuit which generates the actuating signals to be supplied to the second receiver, on the basis of an output from the first receiver.

4. A data receiver according to claim 3, wherein said multiphase clock generator includes a ring oscillator having nodes at which different clocks are generated, and the clocks at the nodes of the ring oscillator are stabilized and output as said multiphase clocks.

5. A data receiver according to claim 3, wherein said first receiver is controlled for burst data transfer such that the first receiver is set in an active state immediately before a strobe signal corresponding to a start item of burst data rises, and is set in an inactive state after a last item of the burst data is received.

6. A data receiver for use in a system wherein data transfer is performed based on data and strobe signals which are supplied to the system almost simultaneously with the data and represent time positions of the data, said data receiver comprising:

a multiphase clock generator for generating a plurality of multiphase clocks which have predetermined phase differences and are equal in period;

a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;

a second receiver which includes units corresponding in number to the multiphase clocks generated by the multiphase clock generator, responds to unit actuating signals at respective ones of these units, receives data in response to another sequence of the multiphase clocks, and transfers the received data; and a circuit which generates the unit actuating signals to be supplied to the second receiver, on the basis of an output from the first receiver.

7. A data receiver according to claim 6, wherein said multiphase clock generator includes a ring oscillator having nodes at which different clocks are generated, and the clocks at the nodes of the ring oscillator are stabilized and output as said multiphase clocks.

8. A data receiver according to claim 6, wherein said first receiver is controlled for burst data transfer such that the first receiver is set in an active state immediately before a strobe signal corresponding to a start item of burst data rises, and is set in an inactive state after a last item of the burst data is received.

9. A data receiver for use in a system wherein data transfer is performed based on data and strobe signals which are supplied to the system almost simultaneously with the data and represent time positions of the data, said data receiver comprising:

a multiphase clock generator for generating a plurality of multiphase clocks which have predetermined phase differences and are equal in period;

a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;

a second receiver which includes units corresponding in number to the multiphase clocks generated by the multiphase clock generator, responds to unit actuating signals at respective ones of these units, receives data in response to another sequence of the multiphase clocks, and transfers the received data; and a circuit which generates the unit actuating signals to be supplied to the second receiver, on the basis of an output from the first receiver, the multiphase clocks to which the units of the first receiver are responsive and the multiphase clocks to which the units of the second receiver are responsive being different from each other and having a predetermined phase relationship.

10. A data receiver according to claim 9, wherein said multiphase clock generator includes a ring oscillator having nodes at which different clocks are generated, and the clocks at the nodes of the ring oscillator are stabilized and output as said multiphase clocks.

11. A data receiver according to claim 9, wherein said first receiver is controlled for burst data transfer such that the first receiver is set in an active state immediately before a strobe signal corresponding to a start item of burst data rises, and is set in an inactive state after a last item of the burst data is received.

12. A data receiver for use in a system wherein data transfer is performed based on data and strobe signals which are supplied to the system almost simultaneously with the data and represent time positions of the data, said data receiver comprising:

a multiphase clock generator for generating a plurality of multiphase clocks which have predetermined phase differences and are equal in period;

a first receiver which includes units corresponding n number to the multiphase clocks generated by the multiphase clock generator, the units receive the strobe signals in response to a sequence of the multiphase clocks, maintain states of the received strobe signals for a predetermined length of time, and then output the states of the strobe signals;

a second receiver which includes units corresponding in number to the multiphase clocks generated by the multiphase clock generator, responds to unit actuating signals at respective ones of these units, receives data in response to another sequence of the multiphase clocks, and transfers the received data; and a circuit which generates the unit actuating signals to be supplied to the second receiver, on the basis of an output from the first receiver, the multiphase clocks to which the units of the first receiver are responsive and the multiphase clocks to which the units of the second receiver are responsive being different from each other and having a predetermined phase relationship, and said second receiver receiving at least two of the data in succession on the basis of a group of two or more multiphase clocks having two or more phase relationships.

13. A data receiver according to claim 12, wherein said multiphase clock generator includes a ring oscillator having nodes at which different clocks are generated, and the clocks at the nodes of the ring oscillator are stabilized and output as said multiphase clocks.

14. A data receiver according to claim 12, wherein said first receiver is controlled for burst data transfer such that the first receiver is set in an active state immediately before a strobe signal corresponding to a start item of burst data rises, and is set in an inactive state after a last item of the burst data is received.

15. A memory system comprising:

a plurality of memory modules which output data and strobe signals indicating time positions of the data; and a controller including a data receiver which receives the data and the strobe signals from the memory modules, said data receiver including:

a plurality of first receivers, driven at predetermined time intervals, for receiving the strobe signals; and at least one second receiver, driven based on outputs from the first receivers, for receiving and transferring the data.

16. A memory system according to claim 15, wherein said first receivers are controlled for burst data transfer such that the first receivers are set in an active state immediately before a strobe signal corresponding to a start item of burst data rises, and are set in an inactive state after a last item of the burst data is received.

17. A memory system comprising:
a plurality of memory modules which output data and strobe signals indicating time positions of the data; and
a controller including a data receiver which receives the data and the strobe signals from the memory modules, said data receiver including:
a multiphase clock generator for generating a plurality of multiphase clocks which have predetermined phase differences and are equal in period;
a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;
a second receiver which responds to an actuating signal and transfers a state of received data; and
a circuit which generates the actuating signal to be supplied to the second receiver, on the basis of an output from the first receiver.

18. A memory system according to claim 17, wherein said multiphase clock generator includes a ring oscillator having nodes at which different clocks are generated, and the clocks at the nodes of the ring oscillator are stabilized and output as said multiphase clocks.

19. A memory system according to claim 17, wherein said first receiver is controlled for burst data transfer such that the first receiver is set in an active state immediately before a strobe signal corresponding to a start item of burst data rises, and is set in an inactive state after a last item of the burst data is received.

20. A memory system comprising:
a plurality of memory modules which output data and strobe signals indicating time positions of the data; and
a controller including a data receiver which receives the data and the strobe signals from the memory modules, said data receiver including:
a multiphase clock generator for generating a plurality of multiphase clocks which have predetermined phase differences and are equal in period;
a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;
a second receiver which includes units corresponding in number to the multiphase clocks generated by the multiphase clock generator, responds to unit actuating signals at respective ones of these units, receives data in response to another sequence of the multiphase clocks, and transfers the received data; and
a circuit which generates the unit actuating signals to be supplied to the second receiver, on the basis of an output from the first receiver.

21. A memory system according to claim 20, wherein said multiphase clock generator includes a ring oscillator having nodes at which different clocks are generated, and the clocks at the nodes of the ring oscillator are stabilized and output as said multiphase clocks.

22. A memory system according to claim 20, wherein said first receiver is controlled for burst data transfer such that the first receiver is set in an active state immediately before a strobe signal corresponding to a start item of burst data rises, and is set in an inactive state after a last item of the burst data is received.

23. A memory system comprising:
a plurality of memory modules which output data and strobe signals indicating time positions of the data; and
a controller including a data receiver which receives the data and the strobe signals from the memory modules, said data receiver including:
a multiphase clock generator for generating a plurality of multiphase clocks which have predetermined phase differences and are equal in period;
a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;
a second receiver which includes units corresponding in number to the multiphase clocks generated by the multiphase clock generator, respond to unit actuating signals at respective ones of these units, receives data in response to another sequence of the multiphase clocks, and transfers the received data; and
a circuit which generates the unit actuating signals to be supplied to the second receiver, on the basis of an output from the first receiver,
the multiphase clocks to which the units of the first receiver are responsive and the multiphase clocks to which the units of the second receiver are responsive being different from each other and having a predetermined phase relationship.

24. A memory system according to claim 23, wherein said multiphase clock generator includes a ring oscillator having nodes at which different clocks are generated, and the clocks at the nodes of the ring oscillator are stabilized and output as said multiphase clocks.

25. A memory system according to claim 23, wherein said first receiver is controlled for burst data transfer such that the first receiver is set in an active state immediately before a strobe signal corresponding to a start item of burst data rises, and is set in an inactive state after a last item of the burst data is received.

26. A memory system comprising:
a plurality of memory modules which output data and strobe signals indicating time positions of the data; and
a controller including a data receiver which receives the data and the strobe signals from the memory modules, said data receiver including:
a multiphase clock generator for generating a plurality of multiphase clocks which have predetermined phase differences and are equal in period;
a first receiver which includes units corresponding in number to the multiphase clocks generated by the multiphase clock generator, the units receive the strobe signals in response to a sequence of the multiphase clocks, maintain states of the received strobe signals for a predetermined length of time, and then output the states of the strobe signals;
a second receiver which includes units corresponding in number to the multiphase clocks generated by the multiphase clock generator, responds to unit actuating signals at respective ones of these units, receives data in response to another sequence of the multiphase clocks, and transfers the received data; and
a circuit which generates the unit actuating signals to be supplied to the second receiver, on the basis of an output from the first receiver, the multiphase clocks to which the units of the first receiver are responsive and the multiphase clocks to which the units of the second receiver are responsive being different from each other and having a predetermined phase relationship, and said second receiver receiving at least two of the data in succession on the basis of a group of two or more multiphase clocks having two or more phase relationships.

27. A memory system according to claim 26, wherein said multiphase clock generator includes a ring oscillator having nodes at which different clocks are generated, and the clocks at the nodes of the ring oscillator are stabilized and output as said multiphase clocks.

28. A memory system according to claim 26, wherein said first receiver is controlled for burst data transfer such that the first receiver is set in an active state immediately before a strobe signal corresponding to a start item of burst data rises, and is set in an inactive state after a last item of the burst data is received.

* * * * *